SEMICONDUCTOR SIGNAL TRANSLATING DEVICES

Filed March 5, 1953 2 Sheets-Sheet 1

INVENTOR
K. B. MC AFEE, JR.

BY [signature]

ATTORNEY

April 23, 1957 K. B. McAFEE, JR 2,790,034

SEMICONDUCTOR SIGNAL TRANSLATING DEVICES

Filed March 5, 1953 2 Sheets-Sheet 2

INVENTOR
K. B. MC AFEE, JR.
BY [signature]
ATTORNEY

United States Patent Office 2,790,034

Patented Apr. 23, 1957

2,790,034

SEMICONDUCTOR SIGNAL TRANSLATING DEVICES

Kenneth B. McAfee, Jr., Morris Plains, N. J., assignor to Bell Telephone Laboratories, Incorporated, New York, N. Y., a corporation of New York Application March 5, 1953, Serial No. 340,529

1 Claim. (Cl. 179—171)

This invention relates to semiconductor signal translating devices and more particularly to junction transistors such as disclosed in Patents 2,502,488, granted April 4, 1950, and 2,569,347, granted September 25, 1951, to W. Shockley.

Junction transistors comprise, generally, a body of semiconductive material having therein a pair of contiguous zones of opposite conductivity types and defining a collector junction. One of these zones constitutes the base region or zone and the other the collector region or zone. In each, carriers of one polarity predominate. Specifically, in a p-type zone, positive carriers or holes are in predominance and in an n-type zone electrons are in the majority. In operation of such devices, carriers of the sign opposite that of the carriers in excess in the base zone are injected into the base zone. For convenience the injected carriers are referred to as minority carriers. The injection may be effected, as illustrated in the patents above identified, by a point contact emitter bearing against the base zone or through the agency of a third, emitter, zone forming a second junction with the base region.

The collector junction is biased in the reverse, or high resistance, direction so that the collector zone is of the polarity to attract the injected carriers. The latter function to control the collector to base current and, hence, the current to a load connected between the base and collector.

Both voltage and power gains are attainable. However, unless special collector constructions are employed, leading to the condition now commonly referred to as the hook collector, the current gain is less than unity, although in some devices it closely approaches unity. The current gain is designated as alpha, termed the multiplication factor, and is defined as:

$$\left.\frac{\partial I_c}{\partial I_e}\right| E_c = \text{a constant}$$

where $I_c$ is the collector current, $I_e$ is the emitter current, and $E_c$ is the collector voltage.

One object of this invention is to increase the current gain of junction transistors. A more specific object of this invention is to facilitate the realization of current multiplication factors greater than unity for junction transistors.

The invention is predicated in part upon the discovery that over a certain range of field strengths across the reversely biased collector junction, a multiplication of charge carriers, both electrons and holes, can be obtained and that this increases as the field strength increases, up to a critical value which corresponds substantially to that sometimes referred to as the Zener voltage. The latter is discussed in some detail in the application Serial No. 211,212, filed February 16, 1951, of W. Shockley. This issued on August 2, 1955, as United States Patent 2,714,702. As appears from the formula set forth in this patent, the collector voltage necessary for breakdown is related directly to both the impurity concentration gradient at the collector junction and the critical electric field needed at the collector junction for breakdown.

It has been found, for example that the onset of carrier multiplication in both silicon and germanium occurs when the average field strength at the junction is between about $6\times10^4$ volts/cm. and $10^5$ volts/cm. and the avalanche breakdown point corresponds to a field strength of about $1.6\times10^5$ volts/cm. for germanium and $2\times10^5$ volts/cm. for silicon. Such a field strength obtains when the voltage across the junction is about one-half the avalanche breakdown voltage. As the voltage increases, as noted hereinabove the carrier multiplication increases until the voltage reaches about the avalanche breakdown value. For increases beyond this, the multiplication decreases.

In accordance with a feature of this invention, accordingly, in a junction transistor the collector junction is biased in the reverse direction and at a value between about one-half the avalanche breakdown voltage and the avalanche breakdown voltage, whereby a large current multiplication factor is obtained. For example, in typical devices substantial increases in alpha have been obtained by operation in accordance with this invention as compared with operation with collector biases of the order of those commonly used heretofore. For NPN and PNP type transistors, alphas of substantially greater than unity have been obtained.

The invention and the above noted and other features thereof will be understood more clearly and fully from the following detailed description with reference to the accompanying drawing in which:

Fig. 1 portrays diagrammatically a junction type transistor having a point contact emitter, illustrative of one embodiment of this invention;

Figure 1:
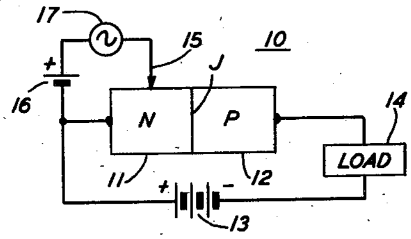

Referring now to the drawing, the junction transistor illustrated in Fig. 1 comprises a body 10 of semiconductive material, such as germanium or silicon, having therein two contiguous zones 11 and 12 of opposite conductivity types forming a junction J. As depicted in the drawing, the base zone 11 is of N conductivity type and the collector zone 12 is of P conductivity type. However, it will be understood, of course, that the conductivity types of the zones may be the reverse of that portrayed in the figure.

The junction J is biased in the reverse direction by a suitable source such as a battery 13 in series with the load 14. Bearing against the base zone 11 in proximity to the junction J is a point contact emitter 15 which is biased in the forward direction relative to the base zone 11 by a source such as a battery 16. A signal source 17 also is connected between the emitter 15 and the base zone 11.

Figure 2:
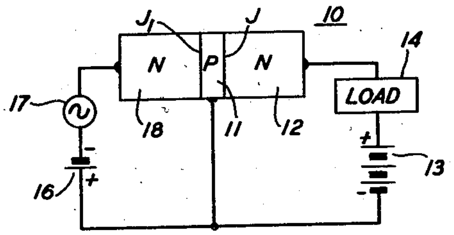
Fig. 2 depicts a junction emitter-junction collector transistor illustrative of another embodiment of this invention.

In the transistor portrayed in Fig. 2, the semiconductive body 10 comprises three zones, namely 11 and 12 forming a junction J and a third, emitter, zone 18 forming a junction $J_1$ with the base zone 11. As in the embodiment illustrated in Fig. 1, in that depicted in Fig. 2 the collector junction J is biased in the reverse direction by the source 13. The emitter junction $J_1$ is biased in the forward direction by the source 16 and signals are applied between the base and emitter zones 11 and 18 respectively by way of a source 17.

In both types of transistors such as illustrated in Figs.

Figure 3:
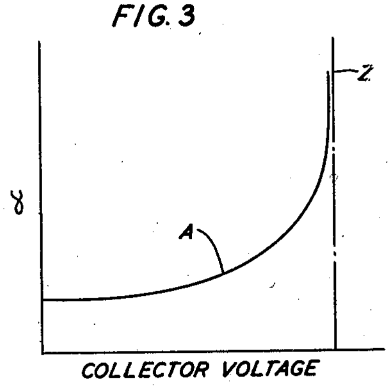
Figs. 3, 4 and 5 are graphs showing performance characteristics of typical devices in accordance with this invention of the construction shown in Fig. 1.

1 and 2, the current multiplication factor alpha is dependent upon the bias across the collector junction. Specifically, in devices of the construction shown in Fig. 1, as illustrated in Fig. 3, for collector biases up to a value of about that corresponding to one-half the avalanche breakdown voltage for the collector junction and indicated at A the current multiplication factor alpha is substantially constant. However, beyond this point and up to the avalanche breakdown voltage indicated at Z in Fig. 3 the current multiplication factor increases markedly. For operation in this region, the source 13 provides a voltage sufficient to result in a voltage bias in the desired range across the collector junction $J_2$ after allowance is made for the voltage drop in the remainder of the path of current flow.

Figure 4:
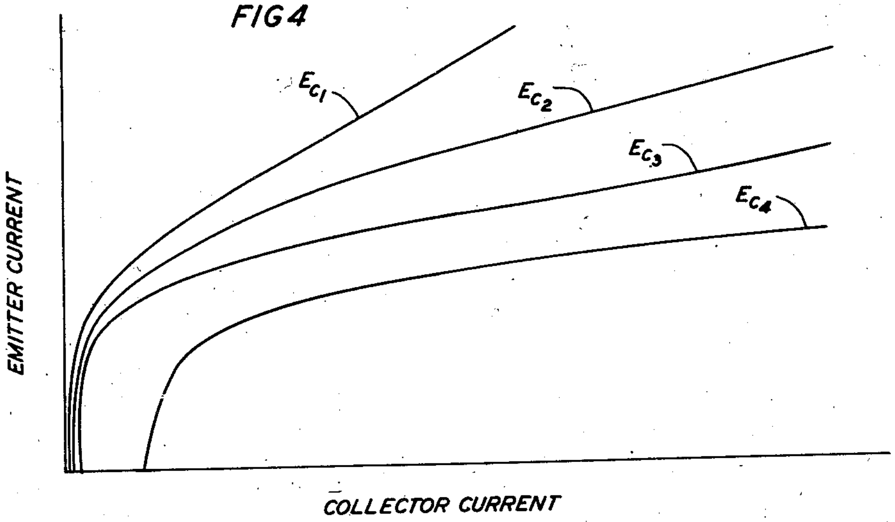

This is represented clearly also in Fig. 4 wherein the ordinates are emitter current and the abscissae are collector current and the third parameter is the collector voltage. The current multiplication factor, as will be apparent, is proportional to the slope of the several curves. As is evident from Fig. 4 for relatively small values of the collector voltage such as represented by curve $Ec_1$ the current multiplication factor may be relatively small. However, as the collector bias voltage is increased successively to values represented by the graphs $Ec_2$, $Ec_3$ and $Ec_4$ the current multiplication factor increases.

Figure 5:
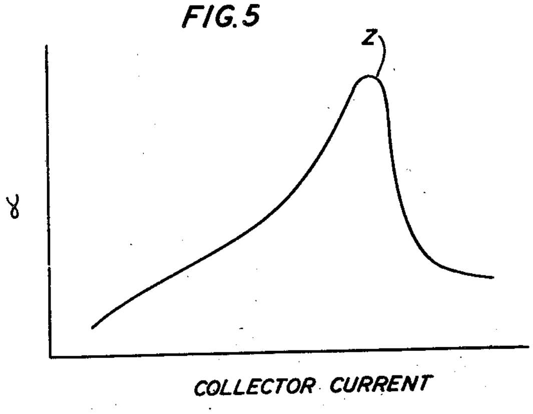

The current multiplication factor approaches a maximum as the avalanche breakdown voltage is approached. This is indicated in Fig. 5 wherein the multiplication factor alpha is plotted as ordinates against collector current as abscissae. In this figure, the point Z corresponds to the collector current at the avalanche breakdown voltage for the collector junction.

As has been indicated hereinabove, the enhancement in the current multiplication factor is associated with or attributable to a carrier multiplication and the onset of such multiplication occurs in both germanium and silicon when the average field strength at the collector junction is between about $6\times10^4$ volts/cm. and $10^5$ volts/cm. In a typical transistor of the construction represented in Fig. 1, the germanium body 10 was a single crystal fabricated in the manner disclosed in the application Serial No. 168,184, filed June 15, 1950, of G. K. Teal, now Patent No. 2,727,840, the P zone 12 being doped with gallium and the N zone 11 being doped with arsenic. The average resistivities of the zones 11 and 12 were about 0.0066 ohm cm. and 0.27 ohm cm. respectively and the gradient of the impurity concentration immediately adjacent the junction J was $3.5\times10^{20}$ cm.$^{-4}$. The avalanche breakdown voltage for the junction J was 33.44 volts and the point of onset of substantial enhancement of the current multiplication factor was 20 volts across the junction.

The overall increase in current multiplication factor realizable in accordance with this invention is many fold. For example, in typical devices of the construction illustrated in Fig. 1, for relatively low values of collector bias, alpha was of the order of .04 whereas for collector biases of about ½ the avalanche breakdown voltage, alpha was of the order of 1.4.

Figure 6:
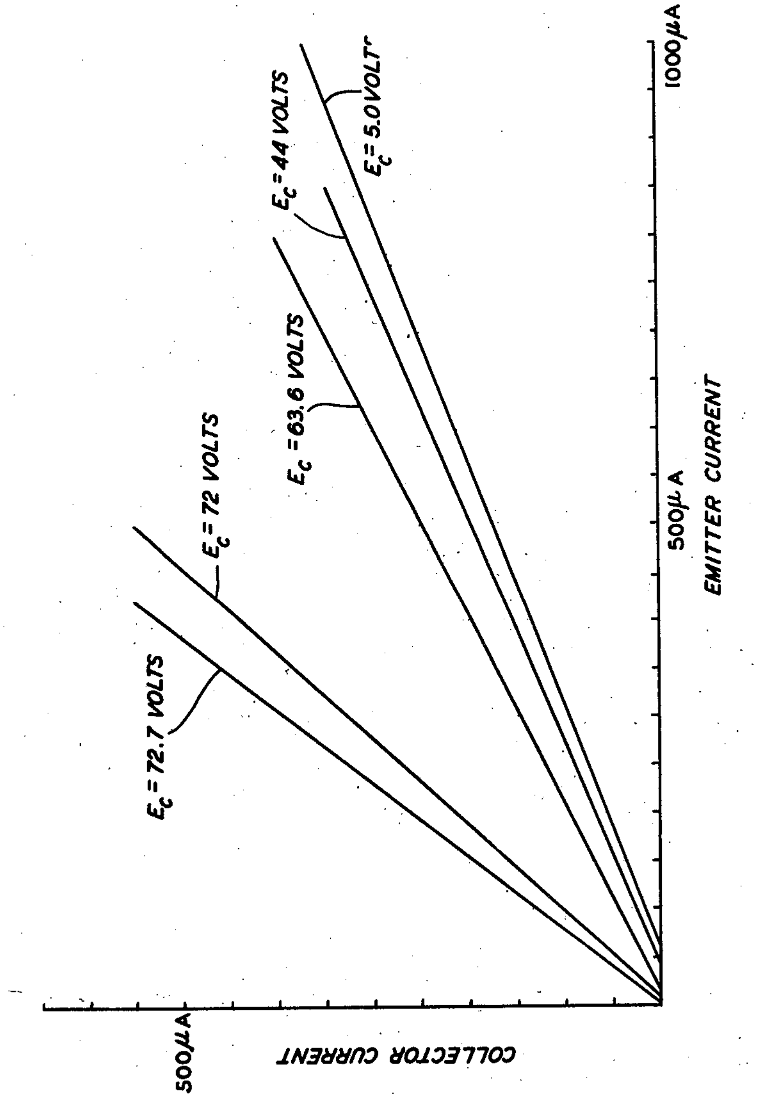
Fig. 6 is a graph representing performance characteristics of a typical device of the construction portrayed in Fig. 2.

Fig. 6 presents performance characteristics of a junction transistor of the construction portrayed in Fig. 2, the coordinates in the figure being as indicated and the third parameter being the collector voltage $E_c$ as indicated on each plot. For values of $E_c$=5, 44 and 63.6 volts the current multiplication factor, alpha, was 0.4, 0.44 and 0.52 respectively. However, for $E_c$=72 volts, alpha was 1.10 and for $E_c$=72.7 volts, alpha was 1.33. For the particular devices represented in Fig. 6, the avalanche breakdown voltage of the collector junction was 73.0 volts. Thus, the enhancement of the current multiplication by biasing the collector junction in accordance with a feature of this invention is evident.

What is claimed is:

A signal translating device comprising a transistor body having therein an n-type zone having an average specific resistivity of the order of .007 ohm centimeter contiguous with a p-type zone having an average specific resistivity of the order of .3 ohm centimeter for defining therebetween a rectifying junction, the gradient of the impurity concentration immediately adjacent the junction being of the order of $3.5\times10^{20}$ cm.$^{-4}$, means for introducing into one of said zones electrical carriers of the sign opposite that of the carriers normally in excess in said one zone, a load circuit connected between said zones, and means for establishing across said junction a reverse bias between approximately twenty and thirty-three volts for providing at the junction between the two zones a reverse biasing electric field in excess of $10^5$ volts/centimeter whereby the alpha realized for the transistor is in excess of unity.

References Cited in the file of this patent

UNITED STATES PATENTS

| | | |
|---|---|---|
| 2,502,488 | Shockley | Apr. 4, 1950 |
| 2,569,347 | Shockley | Sept. 25, 1951 |
| 2,600,500 | Haynes et al. | June 17, 1952 |